United States Patent [19]

Jacobs et al.

[11] Patent Number: 4,817,093

[45] Date of Patent: Mar. 28, 1989

[54] METHOD OF PARTITIONING, TESTING AND DIAGNOSING A VLSI MULTICHIP PACKAGE AND ASSOCIATED STRUCTURE

[75] Inventors: Scott L. Jacobs, Apex, N.C.; Maurice T. McMahon, Jr., Poughkeepsie; Perwaiz Nihal, Hopewell Junction, both of N.Y.; Burhan Ozmat, Dallas, Tex.; Henri D. Schnurmann, Monsey; Arthur R. Zingher, White Plains, both of N.Y.

[73] Assignee: International Business Machines Corporation, Armonk, N.Y.

[21] Appl. No.: 64,976

[22] Filed: Jun. 18, 1987

[51] Int. Cl.$^4$ .............................................. G06F 11/00
[52] U.S. Cl. .................................................... 371/25
[58] Field of Search ........................ 371/25, 20, 15, 27; 324/73 R, 73 AT; 364/200 MS File, 900 MS File

[56] References Cited

U.S. PATENT DOCUMENTS

| | | | |
|---|---|---|---|
| 3,573,751 | 4/1971 | De Lisle | 364/900 |
| 4,441,075 | 4/1984 | McMahon | 371/25 X |
| 4,513,418 | 4/1985 | Bardell | 371/25 |
| 4,519,078 | 5/1985 | Komonytsky | 371/25 |

Primary Examiner—Jerry Smith
Assistant Examiner—Robert W. Beausoliel
Attorney, Agent, or Firm—Steven J. Meyers; Yen S. Yee

[57] ABSTRACT

A self-contained method and structure for partitioning, testing and diagnosing a multi-chip packaging structure. The method comprises the steps of electronically inhibiting all chips in the multi-chip package except for the chip or chips under test, creating a signature of the chip or chips under test by generating and applying random patterns to the chip or chips under test (referred to as the unit under test) and comparing the signature obtained to a "good machine" simulation signature. The structure comprises means for accomplishing the above method steps. A preferred structure comprises an semiconductor substrate having redundant self test circuitry built in and chips having ECIPT circuitry mounted on the semiconductor substrate. Either all or a portion of the self test circuitry, including the required multiplexers, etc., may be incorporated into the semiconductor substrate. ECIPT circuitry may also be built into the substrate below each chip site. The combination of partitioning along chip boundaries, simple and inexpensive testing without external testers or mainframe computers, and enhanced diagnostics are made possible by the present invention.

28 Claims, 6 Drawing Sheets

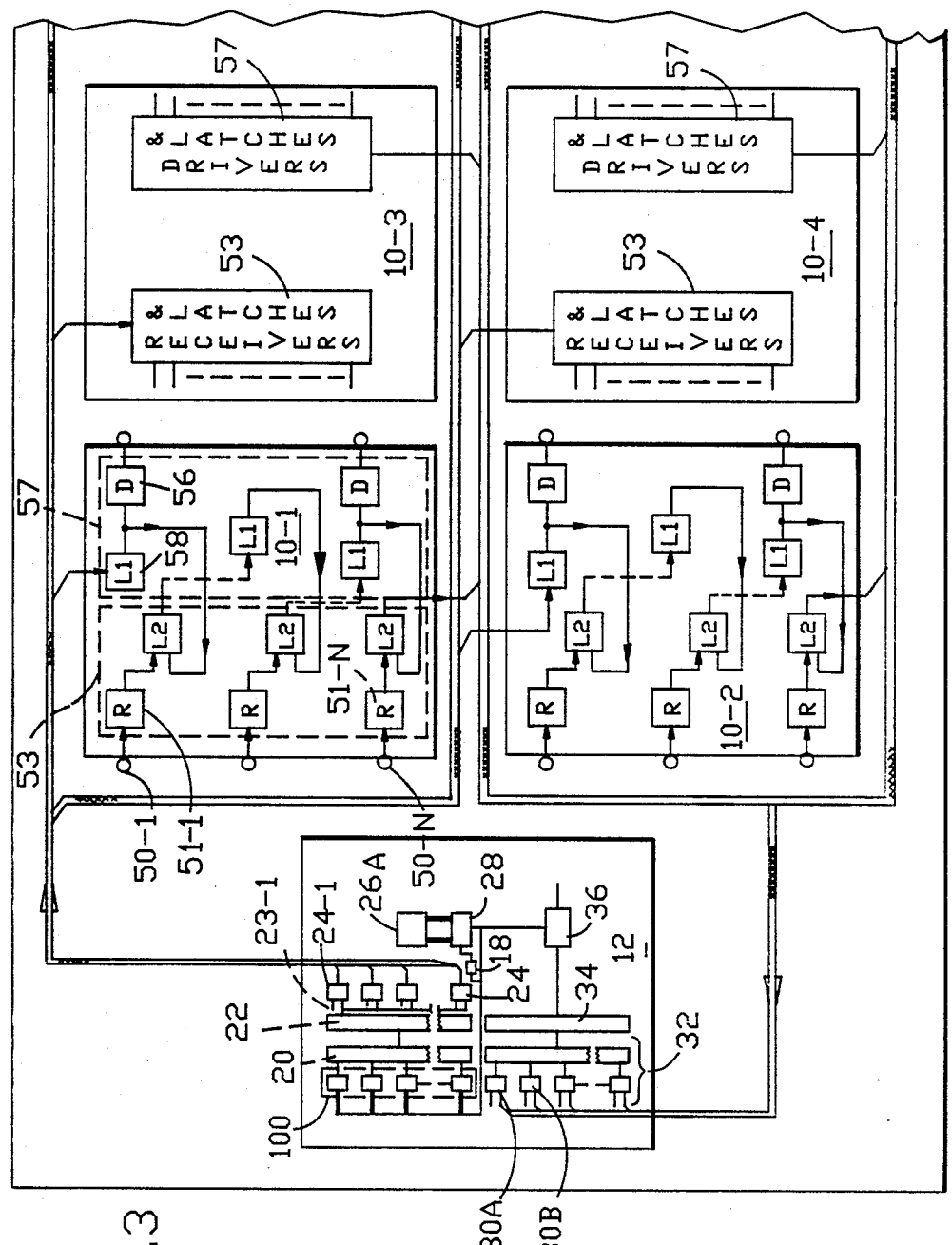

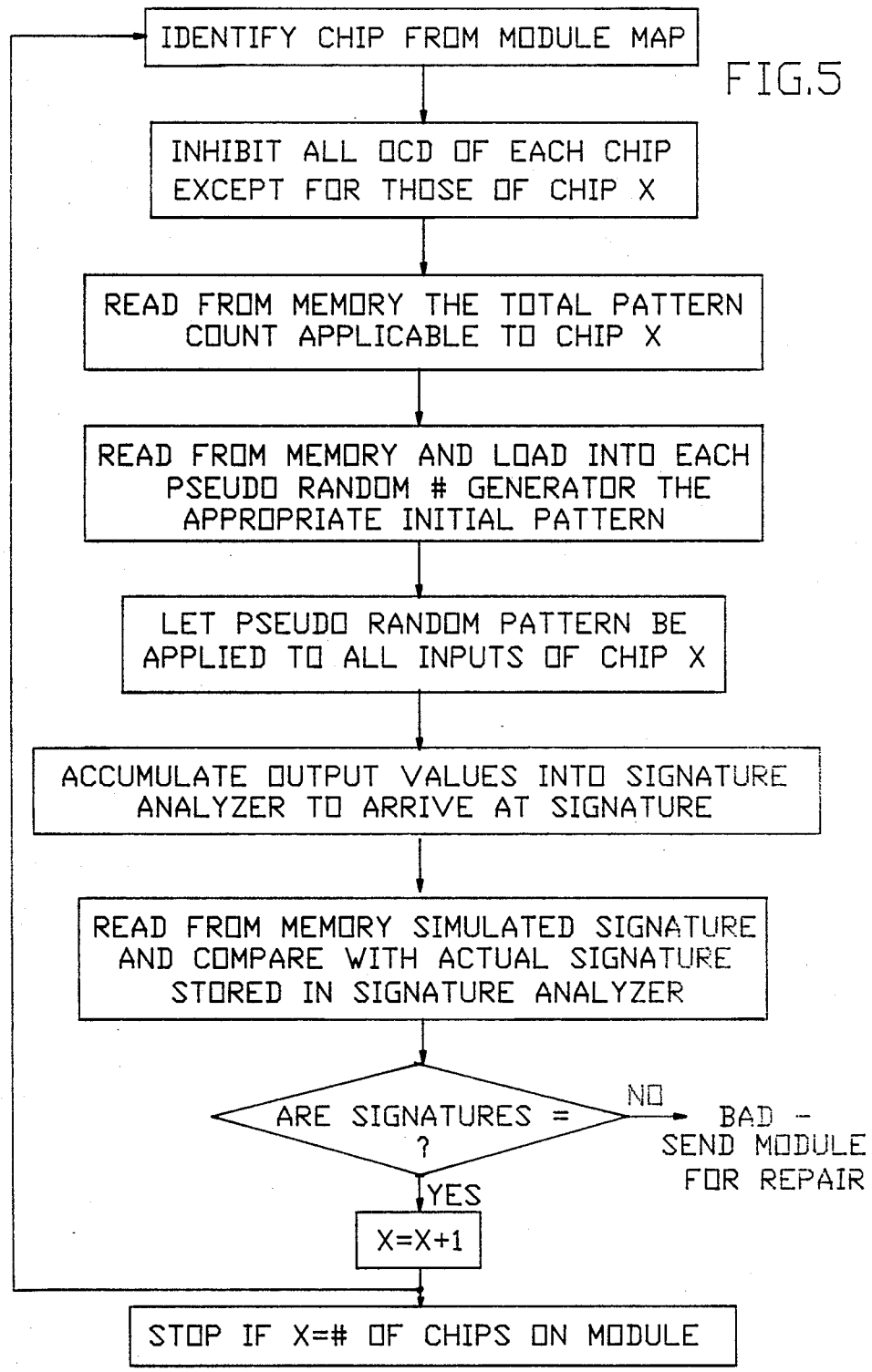

METHOD OF PARTITIONING, TESTING AND DIAGNOSING A VLSI MULTICHIP PACKAGE AND ASSOCIATED STRUCTURE

FIELD OF THE INVENTION

This invention relates to the partitioning, testing and diagnosing of large scale integration (LSI) and very large scale integration (VLSI) semiconductor circuits and particularly to the testing of high circuit density packaging structures, i.e., multi-chip modules, cards, boards, etc.

BACKGROUND

In the art of testing VLSI multi-chip packages, including the chips mounted thereon, it is desirable to do so without expensive test equipment and without spending inordinate amounts of main frame computer time generating multitudes of test patterns. The application of these test patterns ultimately consumes large amounts of tester time, thus adversely affecting the tester throughput. It is also desirable to be able to easily isolate a chip or group of chips under test and diagnose the presence of a defective VLSI chip after mounting these chips on a multi-chip package. Furthermore, it is desirable for a multi-chip package to be self-testable in the field.

Major testing methods used for state of the art testing are Chip-in-Place testing as described in U.S. Pat. No. 4,220,917; Through-The-Pins testing as described in the IBM TDB, Vol. 23, No. 2, July 1980, pp. 607–609; Electronic-Chip-In-Place testing (ECIPT), as described in U.S. Pat. Nos.: 4,494,066 and 4,441,075 and Self-Test techniques, as described in U.S. Pat. Nos.: 3,614,608, 3,719,885 4,519,078 and 3,976,864, as well as many published articles in the technical literature; (see, e.g., the November 1984 issue of IEEE Design and Test entitled, "LOCST: A Built-in Self-test Technique" by LeBlanc, Johnny J.)

Testing by Chip-In-Place testing (CIPT), comprises the testing of each chip contained in a high circuit density packaging structure (without disconnecting the chip to be tested from the high circuit density packaging structure), and requires an array of precisely positioned exposed contact pads (also termed "Engineering Change Pads") for each chip contained and interconnected in the high circuit density packaging structure. The array of precisely positioned exposed contact pads for each chip is utilized by a mechanical test probe head in the testing of each chip. By electrically activating and deactivating one chip at a time, the testing of a high density packaging structure is reduced to the testing of a sequence of individual chips. This method of testing has the disadvantage of requiring a tester and the alignment and subsequent stepping of the probe over the surface of the package and by the necessity of storing and retrieving pertinent test data for each chip to and from computer memory. Moreover, performing self-test and diagnostics in the field is not possible using this method.

A further disadvantage is the poor throughput at the tester, since each chip requires individual sequential testing. Because of the increasing complexity of the logic in high density packaging structures, the testing of chips on a high density packaging structure has become increasingly complex. In order to adequately test such packaging structures, a structured logic design also known as "Design For Testability" is frequently incorporated. The absence of such a structured logic design complicates the task of generating a set of test patterns that will provide an adequate test of multi-chip module. Several approaches to this structured logic design are known in the state of the art, a common structured logic design being LSSD (Level Sensitive Scan Design).

A common thrust of the LSSD approach is to prescribe a built-in test capability for every VLSI unit, such as a chip, module etc., whereby the entire logic state of the unit under test, can be explicitly set and/or examined through exercising certain input/output (I/O) procedures at a limited number of I/O terminals. U.S. Pat. Nos. 3,761,695 entitled "Method of Level Sensitive Testing A Functional Logic System" granted Sept. 25, 1973 to E. B. Eichelberger; and 3,784,907 entitled "Method of Propagation Delay Testing A Functional Logic System" granted Jan. 8, 1974 to E. B. Eichelberger. Stated briefly, the LSSD approach comprises a test operation wherein certain desired logic test patterns are serially inputted and shifted to the appropriate latch locations when the unit is operated in the "shift mode" (i.e., by withholding the system clock excitations and turning on the shifting clock to the unit). When this is done, the latch states will provide the desired stimuli for the testing of the related logic nets. Next, the test patterns are propagated through the nets by executing one or more steps of the "Function Mode" operation (i.e., by exercising one or more system clock excitations). The response pattern of the logic networks to the applied stimuli is captured by the system latches, in a known manner depending on certain details of hardware design, often replacing the original inputted test patterns. Then, the system reverts to the shift-mode operation, outputting the response patterns for examination and comparison with standard patterns which should be present if the circuitry has operated properly. The LSSD technique is employed to design and test the component chips of the package as well as the design and test of the package. The technique logically partitions the dense LSSD logic into portions which are bounded on the inputs and outputs by Shift Register Latches (SRL's) and package pins wherever system logic dictates. Tests are then generated individually for each partition and subsequently applied through the pins of the package at the tester, as described in the Through-The-Pins Test mechanism. The limitations of the partitioning technique are (a) the partition size can exceed the capacity of available LSSD test generators, (b) the turnaround time to generate package tests is excessive, and (c) the turnaround time to regenerate package tests due to an engineering change is also excessive.

Electronic-Chip-in-Place Testing (ECIPT), provides for a design approach and testing method which allows testing of each individual chip of a plurality of interconnected chips through the module pins without physically disconnecting the chip under test. The ECIPT method permits the reapplication of chip test data at higher levels of packaging. The use of ECIPT (Electronic-Chip-In-Place-Testing) for chip isolation and testing is well known to the state of the art. This methodology is commonly used in two versions known as: Half-ECIPT and Full-ECIPT. The difference between them depends on whether only the off-chip drivers of the primary outputs of a chip are tied to an L1/L2 pair (also known as master-slave latch pair) or both the drivers and receivers of the primary outputs of a chip are connected to an L1/L2 pair. This methodology calls for loading appropriate binary values into these master-slave latches which will successively turn off all off-chip drivers on every chip on the module except for the chips under test. In this manner, the chip(s) under test may be tested as if it (they) were alone on the module. Thus, by electrically isolating the chip under test from all others, it now becomes possible to reapply the appropriate chip test patterns to it. The ECIPT methodology has thus far been utilized in conjunction with deterministic patterns. (Deterministic patterns are those which are created by assuming the existence of a fault and then selecting a path between input and output which is sensitive to that fault, i.e. sensitizing a path to detect the fault. This term is used in opposition to random patterns which are not associated to any fault in particular). The application of deterministic patterns to a chip under test presupposes the availability of a computer controlled automatic tester. Otherwise, it would not be possible to generate test patterns and measure the necessary responses at the outputs. We have thus explained how ECIPT partitions logic along chip boundaries making it unnecessary to recreate a set of patterns to test a module, since the same chip patterns can now be reused for the module. We have also established that this testing methodology requires: a tester, which is expensive and cumbersome; the generation and handling of a multitude of test patterns, which is time consuming and labor intensive; and the handling of large amounts of test data. The above considerations are fundamental limitations of the ECIPT technique.

Through-The-Pins Testing, as described in the IBM TDB dated July 1980, pages 607-609, by Carpenter et al, has also been used to test multi-chip modules. This technique essentially treats the multi-chip module as if it were a single chip entity. Test patterns are created to detect all possible faults within that package, oftentimes with the help of partitioning techniques, without which test pattern generation would not always be feasible. Testing is done through the module I/O pins as its name indicates it instead of using the I/O's or EC pads of individual chips. However, a tester and its corresponding burden are still required. Moreover, partitioning is inadequate to form partitions along chip boundaries.

In view of the above, neither ECIPT nor Chip-In-Place Testing, nor testing Through-The-Pins techniques completely satisfy the above stated goals specified for testing multi-chip packages. In particular, using ECIPT, some partitioning problems may be solved, but a tester is still required and large amounts of computer memory must be utilized. Using Chip-In-Place testing, a complex mechanical test process is required, adversely affecting the tester throughput. Using Through-The-Pins testing, an inordinate amount of time must be spent generating the required set of test vectors and partitioning and diagnostic problems are prevalent. In any of the above test methods, elaborate VLSI testers must be used just to apply the vectors to the chip and collect the corresponding responses. In addition, testing is time consuming because the vectors have to be serially shifted in and the responses serially shifted out. Thus, as the density of chips increases, so too does the test generation effort. What is needed, therefore, is a method of testing VLSI chip designs that incorporates the advantages of LSSD, but that does not impose the software management and test generation burdens associated therewith.

One method known in the art to reduce the amount of test data that must be stored when a deterministic method is employed, is "signature analysis". (See Frohwerk, Robert A., "Signature Analysis: A New Digital Field Service Method," Hewlett-Packard Journal, May 1977, pp. 2-8.) In normal LSSD testing, the responses from the test vectors must be compared to known good test vectors. Thus, a large catalog of good test vectors must be stored in order to perform such a comparison. In contrast, signature analysis eliminates the need to generate and store such a catalog of good test vectors. Signature analysis recognizes that an inherent "signature" is present in the data streams of output test response vectors. This "signature" can be derived, and if it is still detected as being present in the response vectors, one is assured that a successful or correct response has been given by the circuit under test.

An additional method known in the art to test LSI circuits is VLSI self test or "random testing". (See, e.g., Sedmak, R. M., "Implementation Techniques for Self-Verification", Proceedings of the 1979 IEEE Test Conference, October 1979, pp. 37-41; Koenemann, Bernd, "Built-in Logic Block Observation Techniques", Proceedings of the 1979 IEEE Test Conference, October 1979, pp. 37-41.) Using this approach, there is no need to externally generate and apply test vectors. Rather, the circuits existing within the VLSI chip design, many of which are designed thereinto solely for testing purposes, are used. Input patterns are randomly generated and applied to the inputs of the unit under test. Said input patterns can be generated, among others, by a Linear Feedback Shift Register (LFSR). Such registers generate long, repetitive pseudo-noise sequences, short segments of which display properties similar to random patterns. The responses of the outputs of the unit under test are accumulated in a Multiple Input Shift Register (MISR), and upon applying a determined set of said patterns it becomes possible to obtain the signature of said network. The aforementioned test generation method can be optimized by assigning different weights to the input leads of the unit under test. Significant advantages may be realized with VLSI self test: (1) test vectors can be generated automatically inside the chip at high speed; (2) neither test nor response vectors need to be stored external to the chip; (3) testing can proceed at much higher speed than is normally possible using LSI testers; (4) no expensive VLSI testers are needed.

Unfortunately, prior art VLSI self test techniques also suffer from some disadvantages. Most particularly, it demands extra resources in terms of design time and chip area. Moreover, the package under test has to be partitioned carefully into smaller testable sections and the designer must exercise considerable skill in mating the self test circuits to the rest of his chip. The overall effectiveness of the self test method depends largely on how skillfully this is done. Careless use of selftest features can waste a lot of chip real estate.

The state of the art test methods described above along with the inherent limitations of each are not adequate to isolate, partition test and easily diagnose VLSI chips on multi-chip modules.

A recent advance in the self test art was made in U.S. Pat. No. 4,519,078 granted to D. Komonytsky on May 21, 1985. Komonytsky teaches that it is possible to combine the Design for Testability Technique, known as LSSD (Level Sensitive Scan Design), with self test and thus do away with the tester. Logic on a module can be partitioned along the boundaries set by the shift register latch banks and letting a set of random patterns be created and applied to each partition. These partitions consist of combinatorial logic. The output responses of said partition can be accumulated on the next bank of shift registers, which provides the second boundary of said partition. Thus a complex module containing a large plurality of chips can be reduced to a limited number of partitions, each comprising some combinatorial logic "sandwiched" between two banks of shift registers, or one set of shift registers and the inputs of the package, or one set of shift registers and the outputs of said package.

It is oftentimes found that for certain applications a logic design may not require any sequential (memory) elements in its design. These designs may eventually lead to chip partitions that are devoid of any latches, and as a consequence may not require any LSSD shift register latches. Assuming that the chips are mounted on a second level package, such as a module (multi-chip-module), Komonytsky's approach would require a logic partition that could theoretically encompass a large portion of the module, which could well be beyond the handling capability of the computer to store and simulate logic. In more general terms, because the latches of Komonytsky are integral with system logic, and thus partitions are determined by system logic, Komonytsky's approach does not teach us how to partition logic in components sufficiently small in the absence of memory elements which can take advantages of a structured design such as LSSD. Komonytsky recognizes existing sequential (memory) elements within the logic organized as shift register latches as natural boundaries for his partitions. In the absence of any such shift register latches in a given chip, such a chip would have to be incorporated into a partition and could not stand by itself as a single chip partition. Moreover, sequential elements, organized as shift register latches (i.e. SRLs) usually do not coincide with either the inputs or outputs of a chip, but are located within the internal logic of a given chip. Thus, a partition may encompass not only purely combinatorial chips, but also portions of chips bounded by the aforementioned shift register latches. Furthermore, the partitions created along SRL boundaries may oftentimes overlap because circuitry of many SRL banks may be required to be used by more than one partition.

In sum, the partitions formed by combining LSSD and self test as taught by Komonytsky are not defined by chip boundaries, but rather they encompass either a multitude of chips and portions thereof or merely portions of a chip or chips. In addition, such partitions overlap each other.

The problems associated with testing very large multi-chip packages, such as multilayered ceramic substrate packages typically having greater than 100 interconnected chips, (i.e. "Thermal Conduction Modules" (TCMs), disclosed in the IBM News, Special Edition, November 1980, Copyright by the IBM Corporation (see FIG. 4A for example), clearly demonstrates how many of the aforementioned testing problems come to light. The existence of at least 100 interconnected chips mounted on a ceramic substrate makes self test techniques impractical unless adequate means for partitioning logic into manageable partitions can be found. Self test techniques in the art require a dedicated test chip. On those packages having a relatively small number of large high density chips, the dedication of a chip site for a test chip can be a major detriment to package and system performance. Furthermore, the task of generating an adequate number of sets of test patterns consumes enormous amounts of CPU time, and the storing and handling of the test patterns likewise imposes great demands on any tester.

The aforementioned testing problems exist for any multi-chip packaging structure having large numbers of chips. Another example of such a multi-chip packaging structure is disclosed in patent application Ser. No. 864,228, wherein means are described for packaging VLSI circuit chips on a semiconductor substrate, preferably silicon. The silicon substrate contains thin-film layers of polyimide and wiring that serves as the media to provide the necessary interconnections between the chips. Like other large multichip packages such as TCMs, such a package is inherently difficult to test. However, the method of the present invention may be applied in a novel structural embodiment to test such a package.

In view of the above, there is a need in the art for finely partitioning and testing a multi-chip package without the need of a tester.

A further need exits to be able to electrically partition either a single chip or a group of chips mounted on a multi-chip module, and test the partitioned chip or chips without a tester.

There is a further need in the art to be able to diagnose each chip or group of chips in a multi-chip package by isolating a defective chip so that the chip can be readily replaced, and the package can be rapidly repaired, and put back into operation or initially installed in a system. There is a need to accomplish such diagnosis without requiring an expensive computer driven automatic tester.

There is a further need in the art to significantly reduce the number of test patterns required to test multi-chip packages.

A further need exists to provide a partitioning, testing and diagnosing method and means that does not require a dedicated test chip.

There is also a need in the art for a method and means of partitioning, testing and diagnosing of a semiconductor base substrate multi-chip package.

SUMMARY OF THE INVENTION

It is an object of the present invention to provide partitioning, testing and diagnostics of a multi-chip package without necessitating the use of a tester.

It is a further object of the present invention to be able to electronically form a partition of either a single chip or group of chips mounted on a multi-chip module.

It is a further object to be able to diagnose each chip or group of chips by isolating a defective chip in a multi-chip package, so that the chip can be replaced and the package can be rapidly repaired and put back into operation or initially installed in a system. Thus it is an object to provide either initial testing of multi-chip modules or in-situ testing during system operation.

It is yet another object to replace any chip with an equivalent chip that has undergone design changes without having to recreate a set of test vectors for the entire multi-chip-module.

It is yet a further object of the invention to isolate and partition the logic of multi-chip packages, and use self test circuitry to test each chip on the module.

It is still a further object of the invention to significantly reduce the number of test patterns required to test multi-chip packages.

Another object is to provide a partitioning, testing and diagnosing method and means that does not require a dedicated test chip.

It is another object of the invention to provide partitioning, testing and diagnosing of a semiconductor base substrate multi-chip package.

It is a further object to provide a structure or structures to carry out the above objects.

It is yet another object of the present invention to create a unique wafer part number that contains a plurality of chips containing self test circuitry which is pre-tested and stored for future use as a substrate for said part number.

The above objects are accomplished by the present invention which comprises a method and interrelated structure, the method being accomplished by combining ECIPT and self-test steps by:

Redesigning the logic on each VLSI chip by connecting every receiver connected to every primary chip input and every off-chip driver connected to every primary chip output to an ECIPT latch, Partitioning the logic on each multi-chip module along chip boundaries by isolating each chip under test from all other chips on the module by applying an appropriate sequence of patterns. The partitioning operation will effectively inhibit all other chips on the multi-chip module from being active and interfering with the chip under test via the chip interconnections, Performing the following operations by test circuitry incorporated in either a dedicated test chip(s), or in the substrate of the multichip package, Identifying the chip under test by its position on the package, Loading into the LFSR of the test chip the initial test pattern that applies to the chip under test, Loading into the Signature Register of the test chip the "good machine" simulated signature of the chip under test, Loading onto the Count Register of the test chip the number of test patterns that are to be generated by the LFSR, Applying the pseudo-random test patterns generated by the LFSR to the chip under test, applying no more than the number of patterns stored in the Count Register, Storing the actual signature of the chip under test in a signature analyzer within the dedicated test chip, Comparing the simulated signature stored in memory with the signature stored in the signature analyzer. If both signatures match, it is inferred that the chip under test is good.

The above process is repeated for the next chip on the package, which is activated by appropriately stimulating the latches connected to the off-chip drivers and receivers and by deactivating the previous chip under test in a similar fashion. The process may be alternatively used for groups of chips if individual chip partitioning is not desired.

The method may be enhanced by applying a set of weighted pseudo-random-patterns instead of purely random patterns.

Corresponding test circuitry are disclosed wherein either a dedicated test chip(s) containing the circuitry to perform self test functions, or a substrate contains the required test circuitry is utilized.

The substrate is also used to test packages which use a semiconductor substrate (e.g., silicon wafer) to package a plurality of chips. In the substrate, or part thereof, individual groups of circuits are fabricated. These might include some or all of the following: latches, shift registers (LFSRs, MISRs (multiple input shift registers)), registers test busses and controls. Thus, each chip mounted on the substrate makes immediate contact with a group of self test circuits. This eliminates the aforementioned test chip and allows for considerable simplification of control circuitry. Corresponding novel apparatus are also disclosed to accomplish the partitioning, testing and diagnosing of such packages.

The method of mounting a plurality of VLSI chips on a silicon substrate comprising a plurality of groups of self test circuits has the distinct advantage of preloading, by means of software, the necessary test data for each chip, thus providing a completely self-testable package in an almost real time environment.

BRIEF DESCRIPTION OF THE DRAWINGS

FIG. 3 is a detailed plan layout of a portion of a multi-chip module depicting a complete self test chip and its interrelationship with the chips on the module that are to be tested.

FIG. 5 is a flow chart depicting the preferred multi-chip module testing process.

TECHNICAL DISCUSSION

Figure 1:
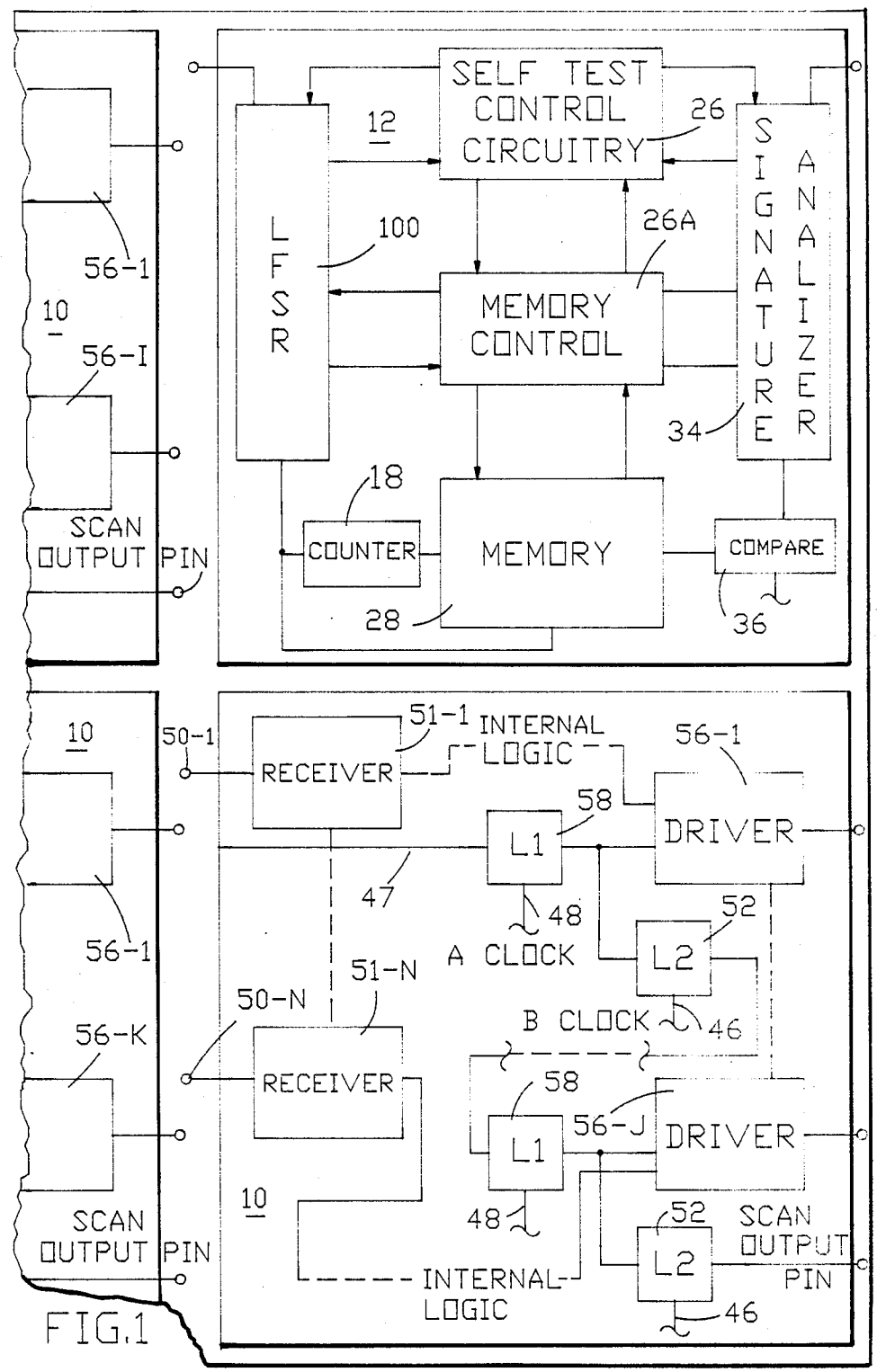
FIG. 1 is a schematic representation of a portion of a multi-chip module depiting a complete self test chip and typical chip to be tested in schematic form.

In order to better understand and appreciate the features of the present invention, it will be helpful to first review some of the basic characteristics of an ECIPT test structure in the context of the present invention. The following is a brief overview of ECIPT, but for a complete description reference is 35 made to U.S. Pat. Nos. 4,441,075 and 4,494,066. ECIPT employs a design structure in which shift register latches, i.e. SRLs, are employed as extended probes. An SRL generally consists of a pair of latches, i.e, the L1 latch and the L2 latch. The L1 latch 58 shown in FIG. 1 has among its inputs a scan data input 47 and a scan clock A, 48. The L2 latch 52 is connected to the output of the L1 latch and among its several inputs is clock B, 46. An N-stage shift register is formed, as shown in FIG. IA, by connecting the A clock inputs of all SRLs to a single external A clock chip pad, then connecting the B clock inputs of all SRLs to an external B clock chip pad, connecting a single pad called the scan input to the scan input of the first SRL in the shift register and connecting the L2 output of the last SRL in the shift register to a single chip pad called the scan output. Using the scan-in clock A and scan-out clock B chip pads, it is possible to load the shift register to any desired state or to observe (unload) the shift register state. The scan data pads of the L1 and L2 latches are generally used for test purposes only, i.e. to load or unload the individual SRLs desired. The L1 and L2 latches may have additional data ports for system usage of the SRLs. For purposes of ECIPT, the L2 latch is capable of having additional data ports as fully explained in U.S. Pat. Nos. 4,441,075 and 4,496,055.

The ECIPT structure provides the means whereby tests generated for a chip can be reapplied when the chip is packaged on a multi-chip module, card, board, system, etc. The structure additionally provides for means for simplified tests of failures associated with interchip wiring on any package level as well as failures associated with the chip inputs and outputs. The intent of the ECIPT design rules is to design chips such that each chip can be isolated for testing purposes through the pins or other contacts of a high level package containing such chips.

The test generation process for an ECIPT chip is essentially identical to that employed for a chip with level sensitive scan design (LSSD) logic and has been widely published. All the apparatus and program controls necessary for generating the test patterns and performing the tests are known in the state of the art. The programs are instrumental in creating an appropriate fault dictionary and creating a set of test patterns of test vectors to detect faults in an automatic mode. The actual application of tests to an ECIPT chip is essentially identical to that employed for LSSD chips and systems, and routinely requires appropriate testing equipment to achieve it. Such testing equipment is usually complex in both its expense and processes involved therein. The present invention also incorporates elements that are used in the field of self test wherein testers and large computers can be reduced or eliminated. Such built-in self test techniques are explained in the article "LOCST: A Built-in Self-Test Technique" by LeBlanc, J. J., of IBM in the November 1984 IEEE Design and Test Magazine. The article uses the generation of pseudorandom sequences through the use of linear feedback shift registers (LFSRs). This technique is known by those skilled in the art, thus the details are not repeated herein. The implementation of a pseudorandom test generator by means of linear feedback shift register is also known by those skilled in the art. Basically the implementation requires interconnecting a series of latch circuits in a shift register configuration and selectively choosing feedback paths that are coupled back to the input through one or more exclusive OR gates. Signature analysis is also part of the self test theory. Signature analysis is also known to those skilled in the art. For example, see Frohwerk, R. A., "Signature Analysis: A New Digital Field Service Method," Hewlett-Packard Journal, May 1977, pp. 2-8. Basically, when signature analysis is used, a signature analyzer compresses an infinitely long stream of data into an end-bit signature. If the unit under test has a fault and that fault is stimulated by a pseudo-random pattern, it causes the signature from the signature analyzer to differ from the expected signature with a probability very close to 1. For example, if a 16-bit signature analyzer is used, it can be shown that the probability of failing to detect an error in a continuous end bit long stream is only $1.53 \times 10^{-5}$.

DESCRIPTION OF THE PREFERRED EMBODIMENTS

The broad concepts of the present partitioning, testing and diagnosing apparatus and method are briefly described with reference to FIG. 1 which schematically represents the self-test/ECIPT combination of the present invention. A chip under test 10 or group of chips under test (hereinafter referred to as the unit under test, i.e. UUT, whether a single chip or a group being tested at once) is isolated from the other chips on a multi-chip packaging structure, such as a multi-chip ceramic module (MCM) or TCM. The self-test/ECIPT combination uses ECIPT techniques such as those taught in U.S. Pat. Nos. 4,441,075 and 4,494,066, which are hereby incorporated by reference, are used to isolate the chip or chips 10 of the UUT and create the desired partitions along chip boundaries. The self test circuitry may be incorporated into the package, as a dedicated test chip 12 or by other means which are described later. The self test circuitry shown schematically in FIG. 1 preferably comprises memory means 28 with its memory control circuitry 26A, to load and fetch appropriate test data, linear feedback shift registers (LFSRs) 100 for generating pseudo-random test patterns, a signature analyzer 34 to create the actual signature of the UUT, a pattern counter register 18, comparing means 36, and self test control circuitry 26 to orchestrate various test operations between the several components that form the self test circuitry. The self test control circuitry (shown schematically as a black box 26 in FIG. 1) can be embodied in many forms. An example of the control circuitry is shown in FIG. 2 wherein the control circuitry required to orchestrate various test operations comprises multiplexers 20, 32, serializer 22, AND gates 24-1, ... 24-M, 30-1, ... 30-M, and chip select lines 23-1, ... 23-M). Note that M is defined as the number of units under test or chips per module, which is also preferably equal to the number of AND gates 23 and 30, or the number of chip or unit select lines 23. Those skilled in the art will appreciate that there may be a different number of each of these gates and select lines depending upon test strategy details.

Prior to the actual physical testing of a UUT, initial steps are performed wherein for every UUT to be tested, a good machine simulation signature is obtained by applying a set of pseudo-random patterns that will ultimately be created by the LFSRs 100 on test chip 12 to a simulated logic model of the UUT. A plurality of the individual simulation signatures are preferably stored in memory 28 together with the respective pattern count to be applied to each UUT under actual test. Details of a typical simulated signature creation and interrelationship of the simulated signature with the LFSRs and control circuitry may be found in U.S. Pat. No. 4,688,223 filed June 24, 1985. The actual testing of an isolated UUT is accomplished by loading from memory 28 into appropriate LFSRs 100 the respective initial patterns and loading into the counter register 18 the number of test patterns to be applied to the UUT. The test patterns are applied to the UUT through primary inputs 50-1, ... 50-N of each chip 10. A final signature is obtained after all test patterns are applied to the chips under test. After the final actual test signature is obtained, the thus obtained actual test signature is compared to the independently simulated "good machine" signature. This basic process is then repeated for each UUT. After partitioning and testing as described above, diagnosing is simplified to an unprecedented degree as will be described hereinafter.

To best follow the self test circuitry portion of the combination of elements briefly described above and schematically shown in FIG. 1, reference is made to FIG. 2. In the present invention the pseudo-random patterns are preferably generated by LFSRs 100. LFSRs 100 and signature analyzers 34 each preferably employ 32 bit registers. Each LFSR 100 may be subdivided into a plurality of smaller LFSRs 100-1, ... 100-N, which may each contain a different initial pattern. Alternatively, LFSR 100 may be a single shift register, wherein each input of the UUT may be connected to different stages of the LFSR. Each LFSR 100 used has a different set of feedback loops (not shown) so that each LFSR produces a different sequence of random numbers. Furthermore, each LFSR is initially preset to a different seed number other than all zeros. This seed number of each initial pattern is fetched from memory 28 by memory control 26A. Note that the self test control circuitry (represented schematically as 26 in FIG. 1) preferably comprises multiplexers 20, 32, serializer 22, AND gates 24-1, ... 24M, 30-1, ... 30M, and chip select lines 23-1, 23M in this embodiment.

When it is desired to weight the inputs to the UUT to produce a greater number of binary 1's than 0's or vice versa, the individual LFSRs 100-1, ... 100-N each have additional weighting circuitry. For details of the weighted random pattern generation, see page 20 and FIG. 3 of U.S. Pat. No. 4,687,988, filed June 24, 1985, which is hereby incorporated by reference. Alternatively, if a single LFSR is used, a plurality of stages of the LFSR would be connected to the appropriate weighting circuitry. The weighting circuitry is capable of producing weights in which the ratio of 0's to 1's or vise versa can be varied from any ratio between 1-1 to 1-31.

The boundaries of each UUT are defined by ECIPT techniques as described above. Before the UUT is actually tested, initial steps as described above must be taken so that a good machine simulation signature is obtained and stored for later comparison with the signature derived from actual values obtained during the testing of the UUT.

In FIG. 2, a plurality of LFSRs 100-1 to 100-N, each containing a different seed number are incorporated into test chip 12. Each UUT is isolated from the other chips on the package by means of ECIPT circuitry as described above. The LFSRs 100-1 to 100-N preferably provide the inputs of each isolated UUT with means for creating a set of preferably weighted pseudo-random patterns. Since the number of primary inputs of each chip on the package varies from one chip to another, a multiplexer 20 is preferably used to bring on line a subset of LFSRs equal to the number of primary inputs of the chip under test or UUT. All LFSRs on the test chip 12 which are in excess of that number remain off-line. Thus, there is a one to one correspondence between the number of active LFSRs generating sequences of pseudo-random patterns and the number of primary inputs on the single UUT. These test patterns are serialized by serializer 22 in order to minimize the required number of I/O's on the test chip. This serialized test pattern is then preferably gated by a plurality of AND gates 24-1 to 24M. However, those skilled in the art will realize that other means for inputting sequences of patterns to the primary inputs of the UUT exist. Each of the gates 24-1 through 24M are activated by a chip select line 23-1 to 23M.

In order to best understand the interrelation between the self-test circuitry, for example as embodied in dedicated test chip 12 and the remaining chips 10-1, ... 10-X and ECIPT circuitry on a multichip module having X number of chips, reference is made to FIG. 3. If chip 10-1 is to be tested, it is isolated from all of the other chips on the MCM by means of ECIPT circuitry. On test chip 12, controller 26A energizes the select chip line 23-1 which in turn will activate AND gate 24-1. Since each LFSR must be connected into a primary input of the chip (one to one correspondence), a huge number of I/O's would normally be required for the test chip. Hence, multiplexer 20 and serializer 22 convert the parallel sequences of patterns from the test chip 12 into a sequential stream of binary numbers which are scanned into the input SRL bank of each chip on the MCM. The number of scan input lines and scan output lines between the test chip and chip under test may further be reduced by additional multiplexing. The thus generated serialized test patterns emerge from the test chip 12 and are scanned into the input SRL bank 53 of chip 10-1. Note that the L1 and L2 latches are grouped in separate SRL banks 53 and 57. This clearly shows the location of partitions along chip boundaries. By activating the appropriate timing clocks A and B, the patterns propagate through the logic, (as detailed in FIG. 1A), and are stored in the SRL bank 57 of the UUT. The sequence of binary values are then scanned out by activating the appropriate timing clocks A and B. Once again the appropriate select line 23-1 of test chip 12 (see FIG. 2 for detail) corresponding to chip 10-1 is energized, thus activating one of a plurality of AND gates, 30-1 in this case. Multiplexer 32 allows only the test pattern that was scanned out of chip 10-1 to be loaded into a serialized signature analyzer 34. Once this operation is completed, the scanned test pattern is generated in LFSRs 100 and serialized by serializer 22 prior to being scanned into the input SRL bank 57 of chip 10-1. The same operation is repeated until the pattern count stored in counter register 18 is (FIG. 2) reached. Ultimately, the plurality of test patterns that are applied to the inputs of the chip under test or UUT create a signature based on the binary values that are successively stored on the SRL bank 53. These values are accumulated in the signature analyzer 34 to form the final signature of the chip under test or UUT. Those skilled in the art will appreciate that if parallel outputs from the test chip are used instead of a serial output, MISRs may replace signature analyzer 34. This final signature is compared with the signature stored in memory 28 which is obtained independently from the good machine simulation, as described above. A favorable comparison between the simulated signature and the signature obtained from actual binary values at the primary outputs of the UUT and accumulated in the signature analyzer 34 indicates at the very least that the chip under test or UUT is not defective. In order to reduce the possibility of test error, a plurality of comparisons may be made between subsets of the actual signatures and corresponding subsets of the simulated signatures.

Testing of the remaining chips or UUTs on the multichip package is achieved in a similar fashion as described above by first isolating the next UUT by means of ECIPT circuitry. Then initial test patterns are loaded from memory 28 into the appropriate LFSRs 100 and the count of test patterns to be applied to the UUT is loaded into the counter register 18. By switching on or off the appropriate number of LFSRs to conform with the number of primary inputs of the chip or UUT and setting appropriate weights on each LFSR 100-1, ... 100-N, applying the patterns generated by the LFSRs to the inputs of the UUT, and accumulating binary values at the outputs of the UUT to form an actual final signature of the UUT, loading the final signature obtained from an independent simulated run into the comparator 36, a comparison may be made between the actual signature and "good machine" simulated signature that will determine if the UUT is not bad and should be replaced by another chip or set of chips. The memory 28 may be an integral part of the self test circuitry or may be placed outside of the test chip body. Control 26A functions to load and fetch from memory the appropriate test data whereas control 26 (FIG. 1) orchestrates the various test operations in the sequence shown in FIG. 5. FIG. 5 is a flow-chart which summarizes the preferred method of partitioning, testing and diagnosing using the present invention. In sum, it comprises the steps of:

i. Identifying the first chip or UUT of the module to be tested. This is achieved by means of a module map that will identify the part number and location of the UUT.

ii. Once the UUT has been identified, the appropriate sequence of binary values is loaded into shift registers along the boundaries at all other chips on the module, thus electrically inhibiting them from interfering with the test of the UUT.

iii. Extracting from memory the total pattern count as it applies to the UUT and load the count into the counter register.

iv. Fetching the initial test pattern from memory and loading it into the LFSR if "pure" self test is used. If weighted pseudo-random patterns are applied to the UUT, a plurality of initial patterns that are to be applied to each input of the UUT are fetched from memory and loaded into the LFSR.

v. The set of pseudo-random or weighted pseudo-random patterns are allowed to propagate through the logic of the UUT, leading to a set of expected binary values that will be found at the outputs of the UUT.

vi. Outputting the binary values from the UUT and accumulating them in the signature analyzer. Results are fed into a comparator.

vii. Fetching the simulated signature for the UUT from memory and inputting it into a comparator which compares it to the actual signature that has obtained from applying test patterns to the UUT.

viii. In the event that the signatures in the comparator do not match, the UUT is defective, and the module is sent to repair with appropriate diagnostic message concerning the failing UUT.

ix. If the signatures match, the UUT is assumed to be at the very least not bad, and the process is repeated for the next UUT.

x. When all chips on the module have been tested and diagnosed, process stops.

The combination of self-test circuitry, i.e., typically embodied in test chip 12, in conjunction with the ECIPT circuitry on the chips 10 of a multi-chip module (i.e. 13 in FIG. 4A) provide the necessary means for a completely self-contained, self-testing package. Furthermore they allow for total isolation of each chip or UUT, and provide means for partitioning along chip boundaries and diagnosing individual chips of groups of whole chips without an external tester and associated main frame computer. Any chip which fails the comparison test between the simulated signature and the actual test signature is recognized as a bad chip, thus providing either an assembly line operator, machine robot or a field engineer with a powerful tool for either diagnosing, debugging or repairing a machine. No other test equipment, complex test probes or mainframe computer would be required. The self-contained partitioning, testing and diagnosing or debugging package is particularly well suited for incremental designs where in the early stages of a machine, each chip must undergo many design changes. These changes, which generally impose a heavy burden on the test engineer by forcing him to create new test data every time a design change is incorporated may now be simplified because the test engineer may now test a redesigned chip by modifying the final signature of the redesign chip and loading the modified signature into the memory of the test chip as the new signature. Moreover, by partitioning along chip boundaries the diagnostic capability allows for instantly ascertaining the identity of a failed chip, thus allowing for a single one to one replacement of that chip, which can be tested in-situ. This provides a diagnostic means for the chip in a complete electronic package environment. Previous self testing means partition logic at boundaries which encompasses either a portion of a chip, a plurality of chips or a plurality of chips plus a fraction of a chip. As an example, see Komonytsky, U.S. Pat. No. 4,519,078 whose partitions are bounded by SRLs which are integral with the system logic and happen to be located wherever system logic dictates. Thus, when a negative test reading comes up in test systems in the art today, one or several chips are replaced, and the tests are repeated by reapplying the same set of patterns. This procedure continues until the test result is positive. In the present invention, the testing is done completely independent of any system logic by precisely defining chip or UUT boundaries as described above. Thus we simplify the diagnostic procedure, which greatly reduces test and debug time when system pair is required. Furthermore, this invention greatly reduces the cycle time required to upgrade a newly created design of a system by allowing any chip to be replaced by an upgraded design level without requiring the regeneration of a complete set of test vectors for the entire module. This method is therefore an efficient means for testing and identifying individual defective chips in a multi-chip module and achieves this objection without requiring any testing equipment or complex programs or mainframe computer time.

The method of the present invention can be applied in packaging structures wherein a semiconductor substrate is used to support chips. An example of such a structure is described in detail in co-pending U.S. application Ser. No. 864,228. The partitioning, testing and diagnostic method and means can be used in packages such as that of U.S. Ser. No. 864,228 and many other packages using semiconductor base structures, for example, silicon on silicon packaging.

TEST CIRCUITRY INCORPORATED IN PACKAGING SUBSTRATE

Figure 1A:
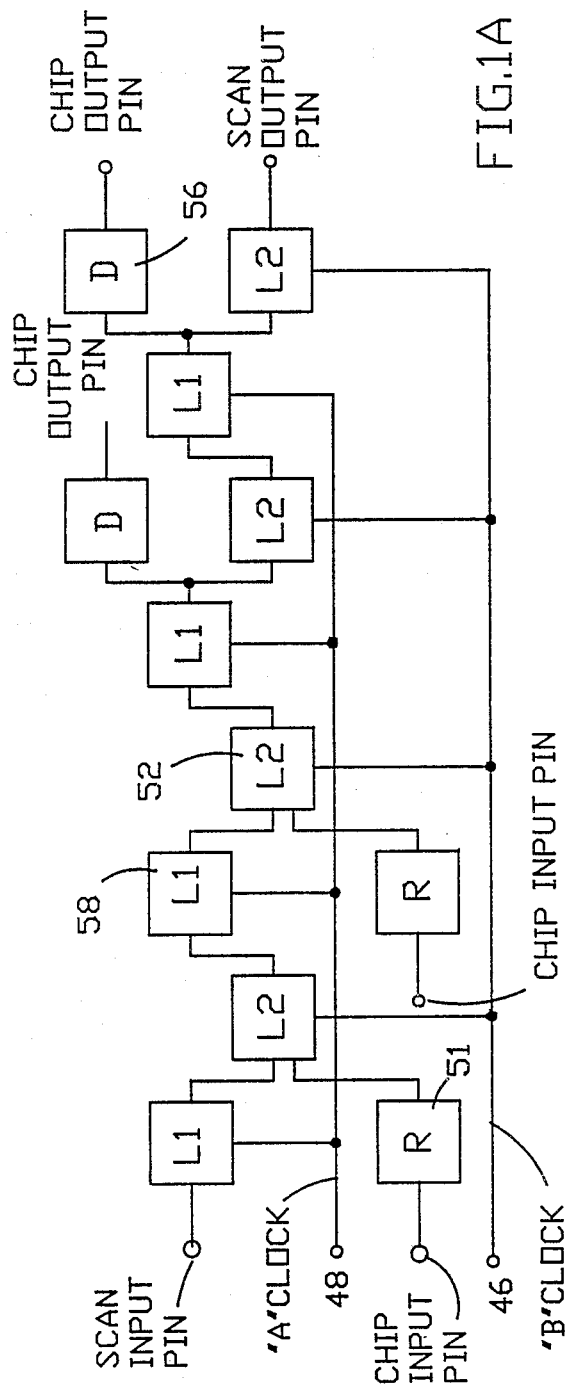
FIG. 1A is a detailed schematic of the interconnections of the various L1/L2 latches to form a shift register bank.
Figure 4A:
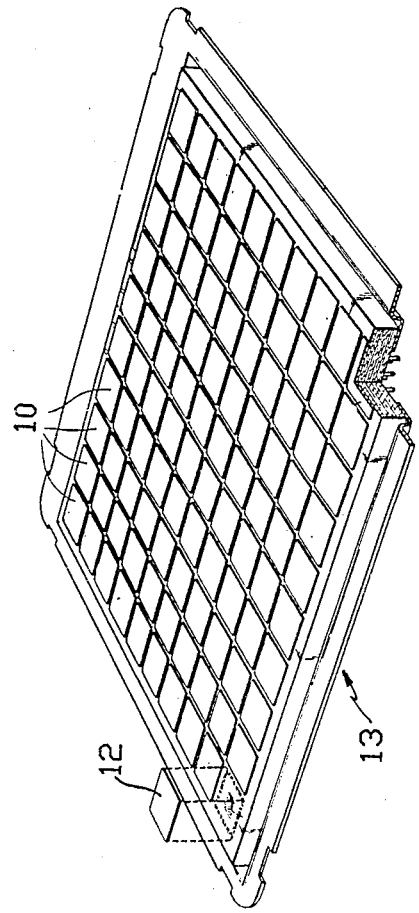
FIG. 4A is a three-dimensional view of a typical multi-chip module to be tested by this invention.
Figure 2:
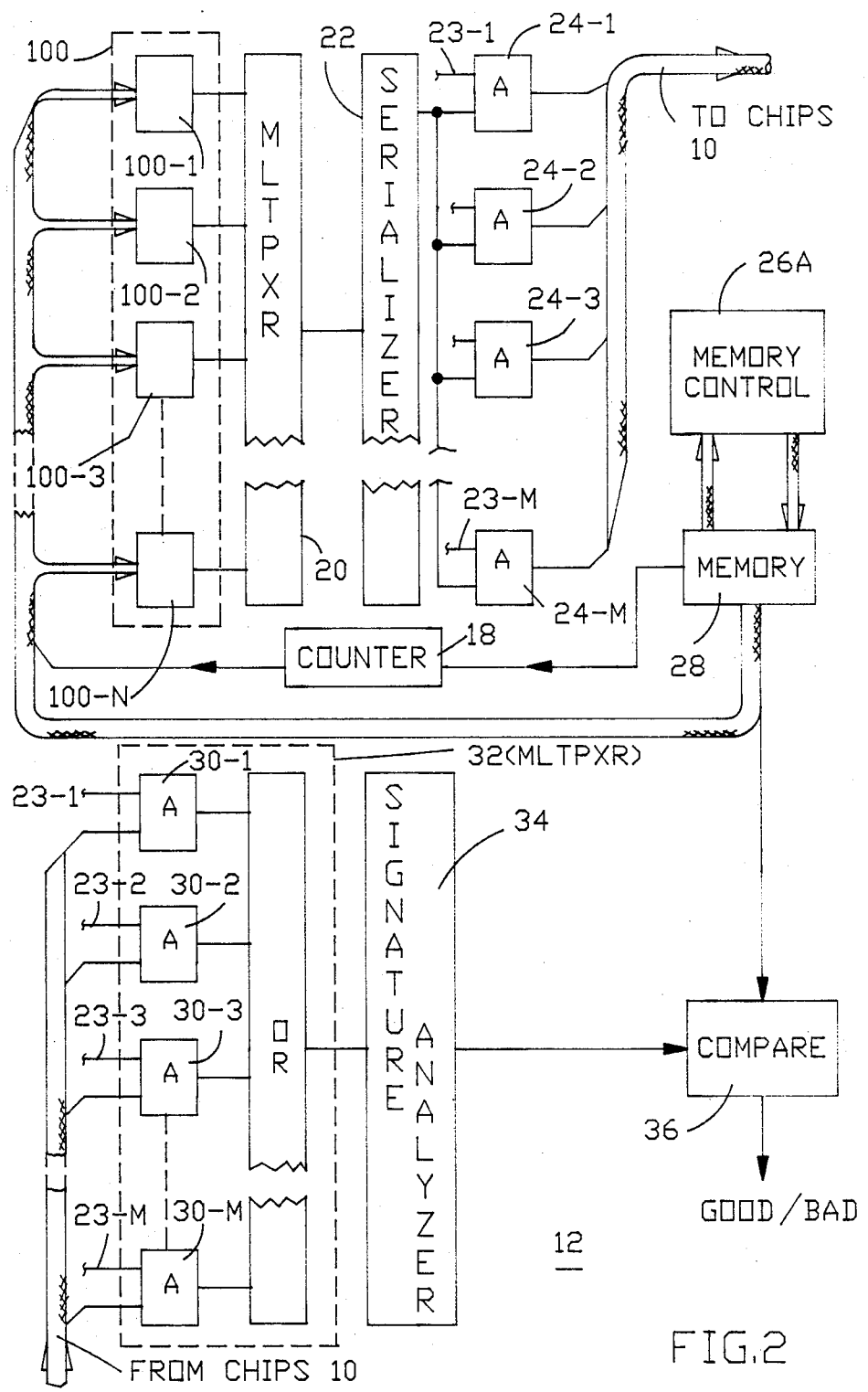
FIG. 2 is a detailed plan layout of the circuitry of the self test circuitry of the preferred embodiment.
Figure 4C:
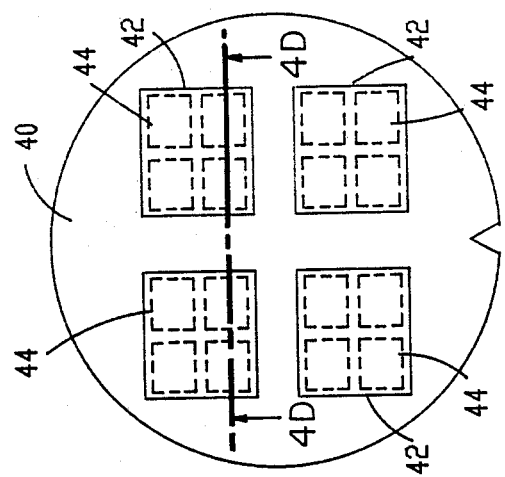
FIG. 4C is a plan view of a multi-chip package having a semiconductor base substrate and built in self test circuitry.
Figure 4D:
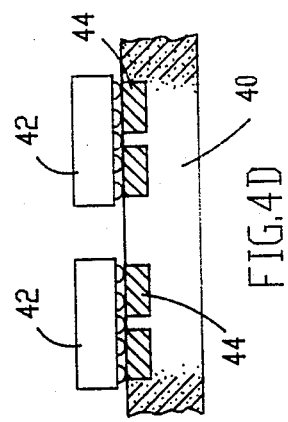
FIG. 4D is a front elevation view of a multi-chip package having a semiconductor base substrate and built in self test circuitry.
Figure 4B:
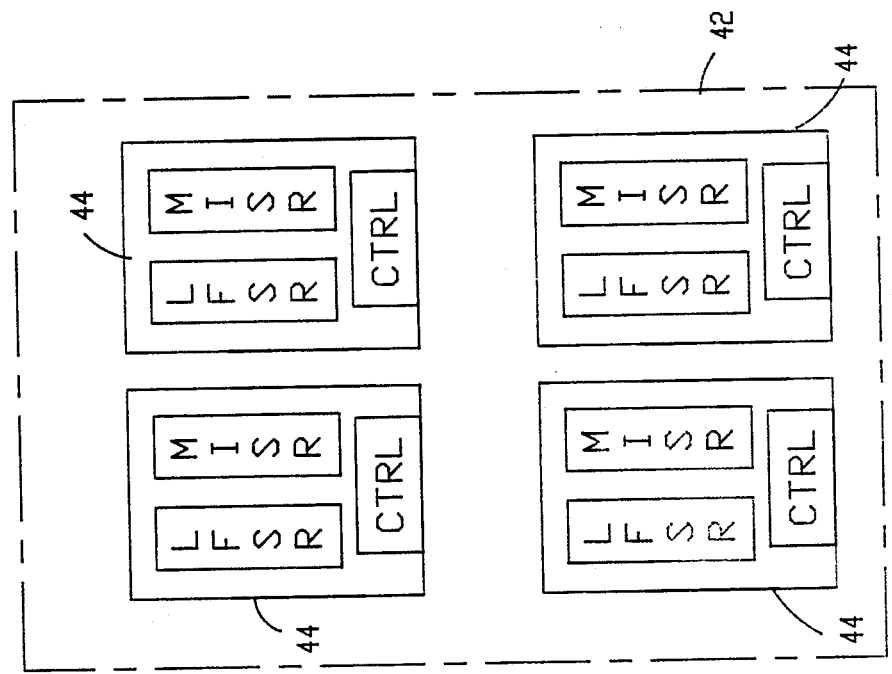
FIG. 4B is a schematic representation of the preferred self test circuitry for testing multi-chip packages having semiconductor base substrates.

Thus far, we have assumed the presence of a dedicated test chip(s) 12 to be mounted alongside the other chips on a multi-chip module as shown in FIGS. 1, 3 and 4A. In applications wherein a semiconductor substrate is used in a packaging structure, i.e. silicon on silicon packages test circuitry may be contained in the semiconductor substrate. In this embodiment (shown in FIGS. 4B, 4C, 4D), the self test circuitry of FIG. 2 is built into the semiconductor substrate 40. The substrate 40 is typically a semiconductor wafer, such as silicon or gallium arsenide, preferably a silicon wafer. Preferably the chips are attached to the wafer by means of C-4 pads (i.e. see U.S. Pat. No. 3,871,015) or solder bump contacts. Interchip connections are made by metallized lines embedded in thin film layers of insulation; for example, see U.S. Ser. No. 864,228. The present invention uses the semiconductor wafer 40 as more than just a means of supporting chips and interchip connections. Prior to using the silicon wafer as a substrate, a plurality of semiconductor test circuit areas 44 are processed. Each test circuit area 44 contains test circuitry similar to the circuitry shown in FIG. 2 and is processed in the same manner as any VLSI wafer. The test circuit areas may also include ECIPT circuitry to interface with and to isolate the chips under test. The wafer 40 having self test circuitry areas 44 is then tested and a wafer map is created showing the location of the good self test circuitry areas 44. The wafer 40 is then processed further to add the insulation and interchip connections for the chips that will be mounted on it. By means of the programmable interconnections, a one to one correspondence is established between one good test circuity area 44 in the wafer 40 with one chip mounted on wafer 40. Since only one test circuitry area 44 is connected to one chip 10 mounted on the substrate 40, the test circuitry shown in FIG. 2 may be greatly reduced to: one LFSR, one signature analyzer or MISR, a smaller memory and control, and a comparator. Also note that the test circuitry may be partly incorporated in the substrate and partly incorporated in a test chip in some applications. Those skilled in the art will appreciate that the method of selection of a good test circuitry area 44 from the plurality of test areas 44 under chip 10 may be achieved by registers, multiplexers and other means (not shown). Most of the gating and multiplexing means, etc., are no longer required because of the one to one correspondence between test circuitry and chip or UUT. The purpose of a wafer map is two-fold: to determine which test circuit areas 44 on the wafer are fully operational and their location on the wafer so that a programmable set of interconnections between the circuitry areas 44 and the chip mounted on the wafer can be created, i.e., preferably E-beam interconnections are permanently assigned to the history of the wafer part number; secondly, a greater number of test circuitry areas 44 than chips mounted on the wafer is required to guarantee at least a one to one correspondence between test circuitry areas and chips under test. This is useful for field engineers to localize and identify a system failure by identifying the failing wafer. With the placement of test circuitry directly underneath the chip, the timing accuracy by which we can delay test the chip is greatly enhanced thereby improving the overall quality level of the testing of the package.

The test operation is generally as follows: the initial test pattern for the LFSR, the pattern count, and the simulated "good machine" signature for each chip are fetched from memory. Chip 10-1 is placed in test mode and all ECIPT SRLs are loaded with the appropriate binary values to inhibit all other chips on the multi-chip module package from interfering with the testing of chip 1. Pseudo-random patterns are generated by the LFSR up to the count stored in the counter register; a final signature is created and compared to that originally fetched from memory and an unfavorable comparison determines that the chip tested is bad. Chip 2 is tested next by placing it in test mode and blocking signals from chip 1 from interfering with the test of chip 2. This is again achieved by appropriately loading ECIPT SRLs with the necessary binary values. The process previously described is then repeated for chip 2 and for every successie chip mounted on the semiconductor wafer 40.

The aforementioned structure has the distinct advantage of unifying under one technology both chip and package and incorporating at the same time the necessary testing partitioning and diagnostic requirements to make the complete entity self contained.

While this invention has been particularly described with reference to the preferred embodiments thereof, it will be understood by those skilled in the art that the foregoing and other changes in form and details may be made therein without departing from the spirit and scope of this invention.

We claim:

1. A method for partitioning and testing a multi-chip packaging structure having at least a packaging substrate, a plurality of chips mounted on said substrate, and test circuitry incorporated into said package comprising the steps of:
   electronically inhibiting all chips on said packaging structure from being active, except for a particular unit under test;
   generating and applying, a set of tailored reproducible random test patterns from an initial pattern to the inputs of the unit under test;
   creating an actual compressed signature of said unit under test in response to; and
   comparing said actual compressed signature of said unit under test with a simulated compressed signature.

2. The method of claim 1 wherein electronically inhibiting is accomplished by activating ECIPT drivers on all chips on said packaging structure except for the unit under test.

3. The method of claim 1 wherein electronically inhibiting is accomplished by activating ECIPT receivers on all chips on said packaging structure except for the unit under test.

4. The method of claim 1 wherein electronically inhibiting is accomplished by activating a combination of ECIPT drivers and receivers on all chips on said packaging structure except for the unit under test.

5. The method of claim 1 wherein a reproducible set of random patterns is generated and applied to said unit under test.

6. The method of claim 5 wherein said random patterns are weighted.

7. The method of claim 1 wherein linear feedback shift registers generate and apply said patterns to said unit under test.

8. The method of claim 1 wherein a reproducible set of psuedo-random patterns is generated and applied to said unit under test.

9. The method of claim 1 wherein said test circuitry is incorporated into said packaging substrate of said multi-chip packaging structure and pretesting of said test circuitry is accomplished before any chips are mounted on said multi-chip packaging structure.

10. A method for partitioning and testing a multi-chip packaging structure having at least a packaging substrate, a plurality of chips mounted on said substrate, and test circuitry incorporated into said package comprising the steps of:
  electronically inhibiting all chips on said packaging structure from being active, except for a particular chip partition under test;
  generating a set of tailored reproducible random patterns from an initial pattern for the partition under test;
  selecting a predetermined number of random patterns to be applied to the partition under test;
  applying said tailored reproducible set of random patterns to the partition under test;
  counting the number of random patterns being applied to the partition under test so that when said predetermined number of random patterns is reached no more patterns are applied;
  generating an actual partition under test compressed signature from said output patterns;
  storing said actual partition under test compressed signature;
  retrieving a simulated compressed signature of the partition under test and
  comparing said simulated compressed signature and said actual partition under test compressed signature.

11. In a multi-chip packaging structure having at least a packaging substrate having chip sites on the top surface thereof, and a plurality of chips mounted on said substrate, integral test circuitry means comprising:
  means for electronically inhibiting all chips on said packaging structure from being active, except for the particular unit under test;
  means for generating and applying a set of tailored reproducible random patterns, from an initial pattern, to the inputs of the unit under test;
  means for creating an actual compressed signature of sid unit under test in response to said set of tailored reproducible random patterns; and;
  means for comparing said actual compressed signature of said unit under test with a signature obtained by simulation means.

12. The multi-chip packaging structure of claim 11 wherein said means for generating and applying a set of reproducible random patterns comprises linear feedback shift registers.

13. The multi-chip packaging structure of claim 11 wherein said means for electronically inhibiting all chips on said packaging structure from being active except for the unit under test comprises ECIPT drivers on all chips on said packaging structure except for the chip unit under test.

14. The multi-chip packaging structure of claim 11 wherein said means for electronically inhibiting all chips on said packaging structure from being active except for the unit under test comprises ECIPT receivers on all chips on said packaging structure except for the chip unit under test.

15. The multi-chip packaging structure of claim 11 wherein said means for electronically inhibiting all chips on said packaging structure from being active except for the unit under test comprises a combination of ECIPT drivers and receivers on all chips on said packaging structure except for the chip unit under test.

16. The multi-chip packaging structure of claim 11 wherein substantially all of said test circuitry means other than said means for electronically inhibiting are contained within a dedicated test chip mounted on a chip site of said packaging substrate.

17. The multi-chip packaging structure of claim 11 wherein said packaging substrate is made at least partially of a semiconductor material.

18. The multi-chip packaging structure of claim 17 further comprising test circuitry means within said semiconductor material of said packaging substrate.

19. The multi-chip packaging structure of claim 18 wherein test circuitry means are located below each of said chip sites.

20. The multi-chip packaging structure of claim 19 wherein there are redundant test circuitry means located below each of said chip sites.

21. The multi-chip packaging structure of claim 20 wherein there are redundant means for electronically inhibiting located below each of said chip sites.

22. The multi-chip packaging structure of claim 17 wherein means for electronically inhibiting are contained within said semiconductor material of said packaging substrate.

23. The multi-chip packaging structure of claim 22 wherein means for electronically inhibiting are located below each of said chip sites.

24. The multi-chip packaging structure of claim 11 wherein said random patterns are weighted random patterns.

25. The multi-chip packaging structure of claim 11 wherein said means for generating a reproducible set of random patterns comprises a plurality of linear feedback shift registers.

26. The multi-chip structure of claim 11 wherein said test circuitry means include individual dedicated test circuitry for each partition under test.

27. The multi-chip structure of claim 26 wherein each of said partition under test is each of said chip sites.

28. The multi-chip structure of claim 26 wherein said packaging substrate is made at least partially of a semiconductor material, and said individual dedicated test circuitry is within said semi-conductor material.

* * * * *